United States Patent [19]

Nakamori

[11] Patent Number: 4,558,233
[45] Date of Patent: Dec. 10, 1985

[54] CMOS POWER-ON RESET PULSE GENERATING CIRCUIT WITH EXTENDED RESET PULSE DURATION

[75] Inventor: Tutomu Nakamori, Kawasaki, Japan
[73] Assignee: Fujitsu Limited, Kawasaki, Japan
[21] Appl. No.: 467,075
[22] Filed: Feb. 16, 1983

[30] Foreign Application Priority Data

Feb. 16, 1982 [JP] Japan ............................... 57-23309

[51] Int. Cl.⁴ .................... H03K 5/153; H03K 17/687
[52] U.S. Cl. .................................. 307/362; 307/354; 307/579; 307/267; 307/594
[58] Field of Search ................... 307/200 B, 443, 448, 307/451, 475, 351, 354, 362, 363, 577, 579, 585, 265, 267, 590, 592, 594, 601, 603, 605, 296 R

[56] References Cited

U.S. PATENT DOCUMENTS

| | | | |
|---|---|---|---|
| 4,013,902 | 3/1977 | Payne | 307/363 |
| 4,103,187 | 7/1978 | Imamura | 307/585 |
| 4,140,930 | 2/1979 | Tanaka | 307/362 |
| 4,173,756 | 11/1979 | Kawagai et al. | 340/636 |
| 4,196,362 | 4/1980 | Maehashi | 307/350 |
| 4,300,065 | 11/1981 | Remedi et al. | 307/264 X |
| 4,322,639 | 3/1982 | Yamashiro | 307/363 X |
| 4,405,871 | 9/1983 | Buurma et al. | 307/362 X |
| 4,409,501 | 10/1983 | Eickerman et al. | 307/585 X |

FOREIGN PATENT DOCUMENTS 2600197 8/1976 Fed. Rep. of Germany .
2059707 4/1981 United Kingdom .

OTHER PUBLICATIONS

Patents Abstracts of Japan, vol. 3, No. 82, Jul. 14, 1979, p. 75 E 123 & JP-A-54 60849 (Fujitsu K.K.), 16-0-5-1979, Abstract; figure.

Primary Examiner—Stanley D. Miller
Assistant Examiner—D. R. Hudspeth
Attorney, Agent, or Firm—Staas & Halsey

[57] ABSTRACT

A source voltage buildup detecting circuit which detects, after the source is switched on, whether the source voltage is higher than a predetermined voltage and outputs a detecting signal. The source voltage buildup detecting circuit includes a complementary metal-oxide semiconductor (CMOS) inverter, a level shifting element connected between the power source and the CMOS inverter, and a voltage generating circuit connected to an input of the CMOS inverter. The level shifting element supplies a voltage lower than the source voltage to the CMOS inverter as a working voltage, and when the source voltage becomes greater than the predetermined voltage after the source voltage is switched on, the voltage generating circuit outputs a voltage higher than the threshold voltage of the CMOS inverter. When the source voltage becomes higher than the predetermined voltage, the voltage generating circuit outputs a voltage lower than the threshold voltage of the CMOS inverter.

6 Claims, 23 Drawing Figures

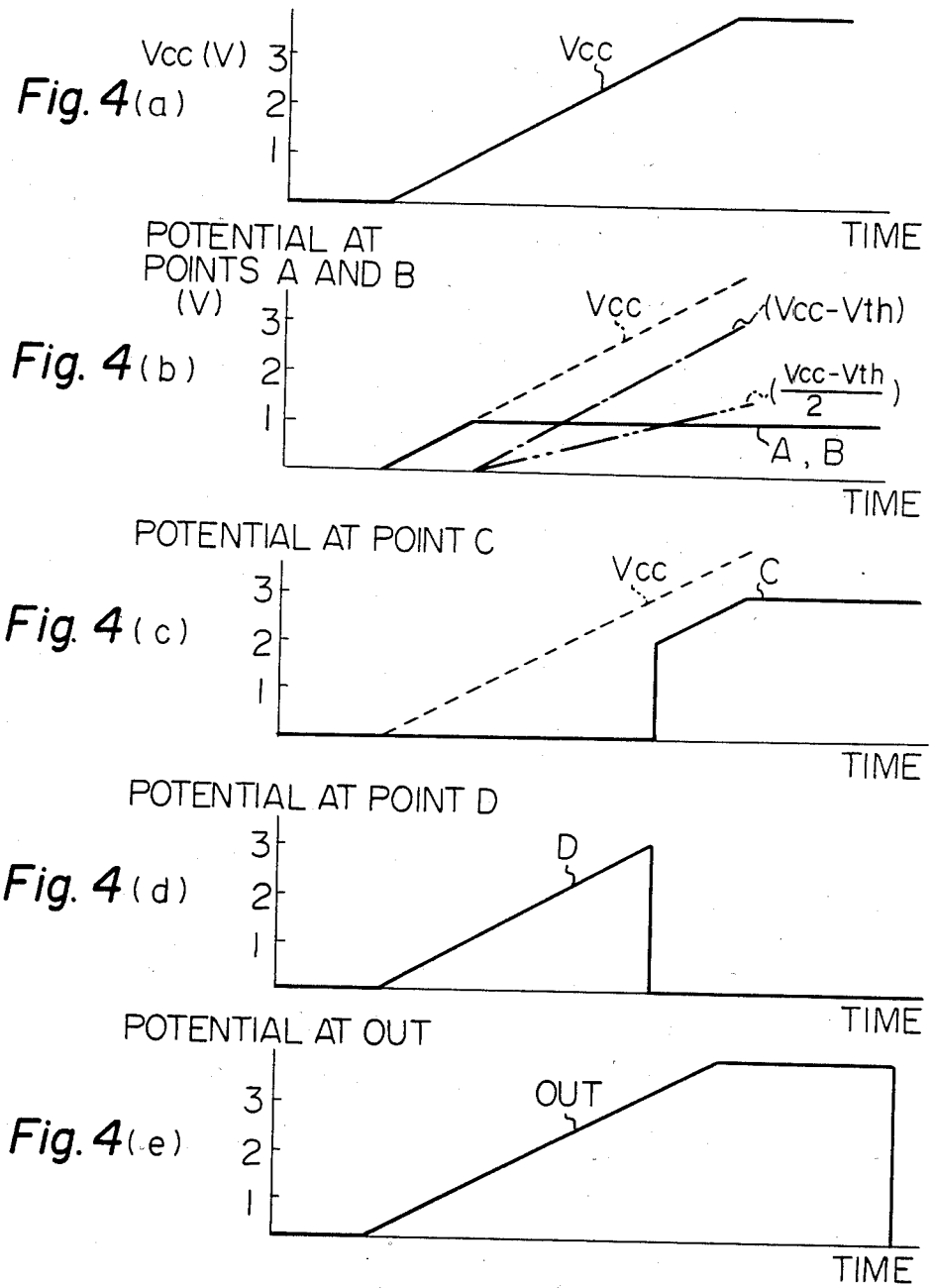

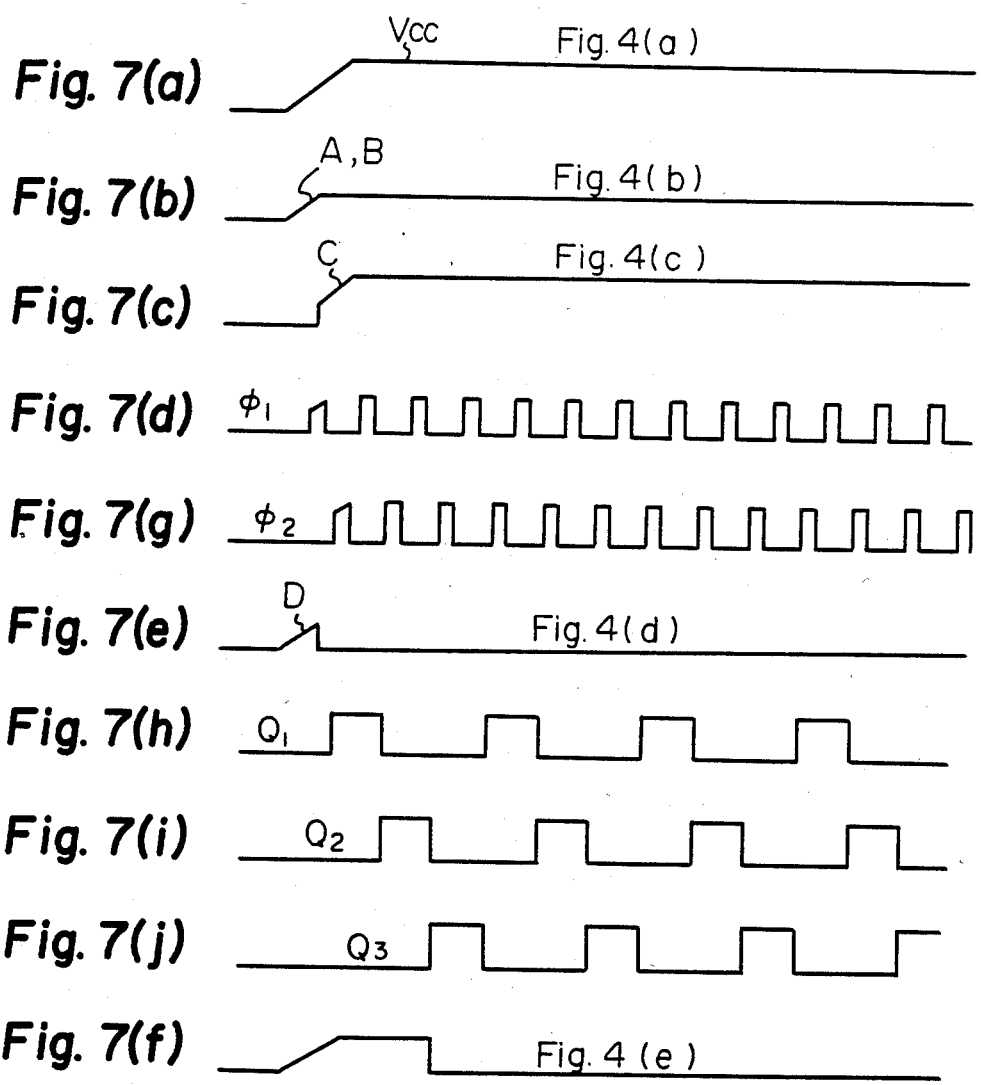

CMOS POWER-ON RESET PULSE GENERATING CIRCUIT WITH EXTENDED RESET PULSE DURATION

BACKGROUND OF THE INVENTION

The present invention relates to a voltage detecting circuit. More particularly, the present invention relates to a circuit for detecting the buildup of the power source voltage and which is used when an internal circuit is automatically reset at the time the power source is switched on.

When electronic equipment is operated, functional blocks constituting the electronic equipment are first reset to the initial state and then operated normally. Accordingly, each functional block is provided with a signal input terminal for resetting an internal circuit within a certain time after the power source voltage reaches a predetermined level, and, furthermore, a circuit for detecting the build up of the power source voltage is arranged in each functional block to output reset pulses before the power source voltage reaches the predetermined level. An integrated circuit consisting of a capacitor and a resistor is often utilized as a power source voltage buildup detecting circuit of this type.

Recently, with the development of the integrated circuit, this type of power source voltage build up detecting circuit has been built into the integrated circuit, and thus the integrated circuit per se is automatically reset. The technique is generally adopted in microprocessors which are used in various fields, and various modes are considered for the power source voltage buildup detecting circuit. Ordinarily, however, there is adopted a type of mode in which the output of a series circuit consisting of a capacitor, a resistor, and a metal-oxide semiconductor (MOS) transistor is amplified by using an inverter stage.

However, in the above-mentioned circuit, the threshold voltage of the transistor is practically 0.8 V, and therefore the output voltage of the circuit is only 1.6 V at the highest. As a result, the level of the circuit is low, and operation of the functional blocks can not be guaranteed. This is a problem in the conventional technique.

SUMMARY OF THE INVENTION

An object of the present invention is to provide a circuit for detecting the buildup of the power source voltage, in which erroneous operation is greatly reduced and normal operation can be guaranteed.

The above-mentioned object can be achieved by providing a source voltage buildup detecting circuit which detects, after the source is switched on, whether the source voltage is higher than the predetermined voltage and which outputs a detecting signal. The source voltage buildup detecting circuit includes a complementary metal-oxide semiconductor (CMOS) inverter, a level shifting element which is connected between the source voltage and the CMOS inverter, and a voltage generating circuit which is connected to an input of the CMOS inverter. The level shifting element supplies a voltage lower than the source voltage to the CMOS inverter as a working voltage. When the source voltage becomes lower than the predetermined voltage after the source voltage is switched on, the voltage generating circuit outputs a voltage higher than the threshold voltage of the CMOS inverter. When the source voltage becomes higher than the predetermined voltage, the voltage generating circuit outputs a voltage lower than the threshold voltage of the CMOS inverter, and, therefore, when the source voltage reaches a predetermined value, the output of the CMOS inverter is inverted.

Further features and advantages of the present invention will be apparent from the ensuing description, made with reference to the accompanying drawings, to which, however, the scope of the invention is in no way limited.

BRIEF DESCRIPTION OF THE DRAWINGS

FIG. 2, including

FIG. 4, including FIGS. 4(a)–4(e), is a timing chart of voltage changes at respective points in the circuit shown in FIG. 3;

FIG. 7, including FIGS. 7(a)–7(f), is a timing chart of voltage changes at respective points in the circuits shown in FIGS. 5 and 6.

DESCRIPTION OF THE PREFERRED EMBODIMENT

Figure 1:
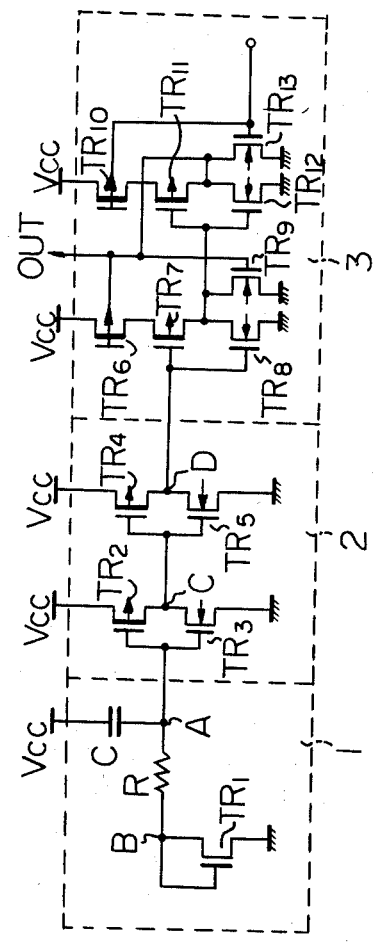
FIG. 1 is a circuit diagram of a conventional circuit for detecting the buildup of the power source voltage.

A conventional circuit for detecting the buildup of the power source voltage is shown in FIG. 1. This circuit consists of a series circuit 1 consisting of a capacitor C, a resistor R and an N-channel MOS transistor TR1, an amplifying stage 2 consisting of two CMOS inverter stages, and an output stage 3 having a NOR flip-flop circuit. In FIG. 1, for simplification, a P-channel MOS transistors are indicated by a thick solid line.

Figure 2A:
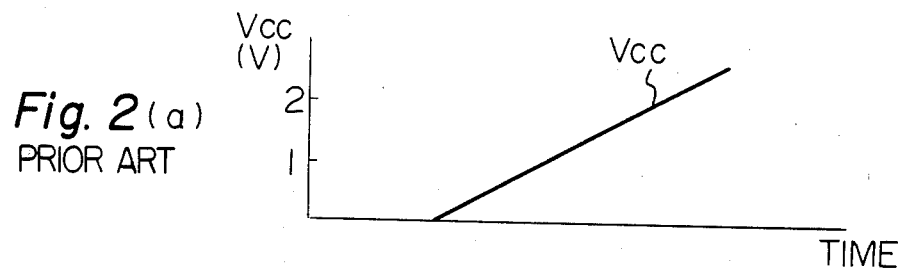
FIGS. 2(a)–2(d), is a timing chart of voltage changes at respective points in the circuit shown in FIG. 1.
Figure 2B:
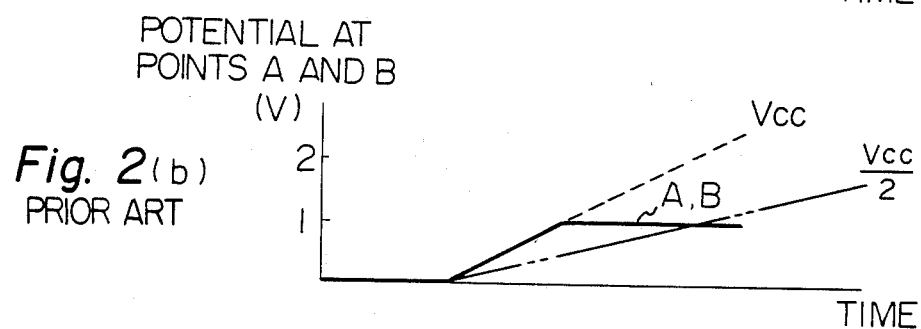
Figure 2C:
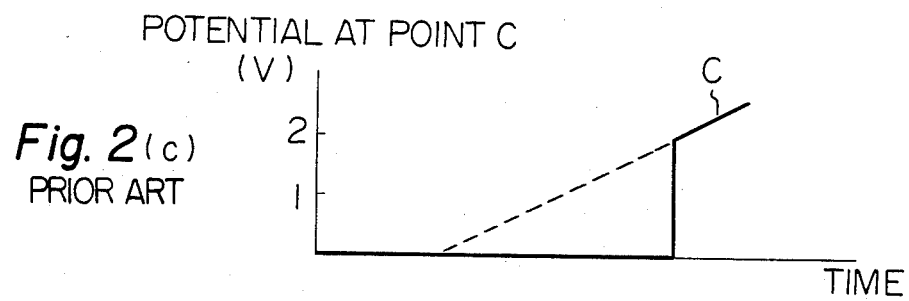
Figure 2D:
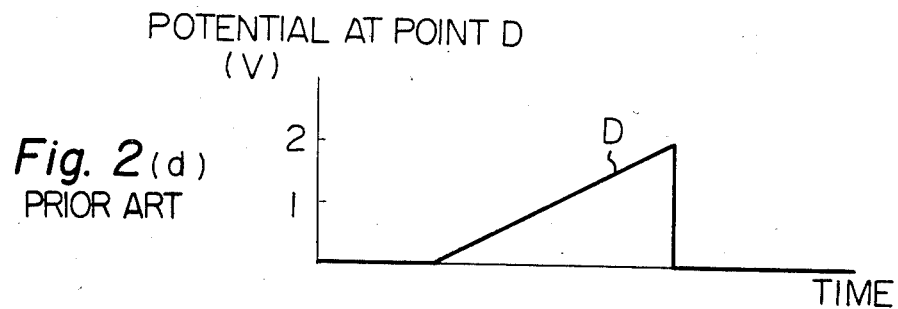

The operation of the conventional circuit will now be described with reference to FIG. 2. When the power source voltage $V_{cc}$ to be applied to the entire system, which includes the circuit of FIG. 1, is gradually elevated, as is shown in FIG. 2(a), buildup of the voltage level at point A through the capacitor, as is shown in FIG. 2(b), results. Also, the voltage at point B is elevated together with the voltage at point A, but the voltage at point B is clamped so that it is equal to the threshold voltage (about 1 V) of the transistor TR1. The CMOS inverter comprises the P-channel transistor TR2 and the N-channel transistor TR3, which have a threshold voltage of $V_{cc}/2$. The transistor TR3 is maintained in the on state until the $V_{cc}/2$ line reaches the clamped level at points A and B. Then, the transistor TR2 is turned on, and the output at point C contributes to the buildup of the power source voltage $V_{cc}$, as is shown in FIG. 2(c). The transistor TR5 is turned on due to the buildup of the output at point C, while the output at point D drops, as is shown in FIG. 2(d).

In the above-mentioned conventional circuit, since the voltage at point A is clamped to about 1 V, the output at point D is 2 V at the highest. Incidentally, since the threshold voltage of the transistor TR4 is practically 0.8 V, the output at point D is only 1.6 V at the highest. Since the level of the output at point D is relatively low, operation of the flip-flop circuit 3 cannot be guaranteed. This is a problem involved in the conventional technique.

This problem can be solved only by elevating the clamped voltage at point A, and elevation of the clamped voltage at point A can only be achieved by increasing the threshold voltage of the transistor TR1. However, since the voltage at point A is retained even after the power source voltage is stabilized, if the voltage at point A is increased, both the P-channel and N-channel transistors of the CMOS inverter are turned on, and, therefore, a direct current flows.

Figure 3:
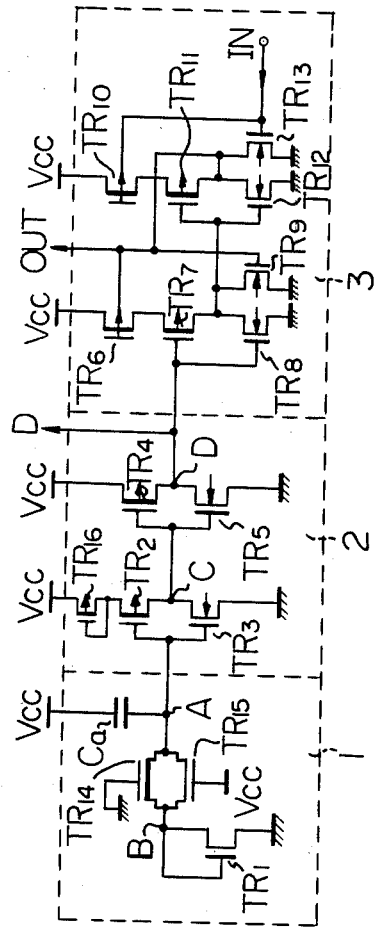
FIG. 3 is a circuit diagram of an embodiment of a circuit according to the present invention for detecting the buildup of the power source voltage.

FIG. 3 is a circuit diagram of a circuit according to the present invention for detecting the buildup of the power source voltage. In FIG. 3, the output of the inverter stage 2 can be increased without elevation of the clamped voltage of the series circuit 1 shown in FIG. 1.

In FIG. 3, the same reference numerals as those used in FIG. 1 represent the same members as in FIG. 1. In this embodiment, a P-channel transistor TR16, used as the threshold value element, is connected in series between the P-channel transistor TR2 of the CMOS inverter located in the input stage of the inventer stage 2 and the $V_{cc}$ terminal. The resistive element formed by the MOS transistors TR14 and TR15 can be used in place of the pure resistor shown in FIG. 1.

The operation of the circuit of this embodiment will now be described with reference to FIG. 4. Due to the buildup of the power source voltage $V_{cc}$, the voltage at point A is elevated, as is shown in FIG. 4(a). Due to utilization of the transistor TR16, the voltage between the terminals of the transistors TR2 and TR3 is adjusted to $V_{cc} - V_{th}$, as is shown in FIG. 4(b). $V_{th}$ represents the threshold voltage (practically 0.8 V) of the transistor TR16. Accordingly, the threshold value of the CMOS inverter of the transistors TR2 and TR16 is $(V_{cc} - V_{th})/2$, as is shown in FIG. 4(b). Since the voltage at points A and B is maintained at the level clamped by the transistor TR1 (about 1 V), the transistor TR3 is turned on before the voltage intersects the $(V_{cc} - V_{th})/2$ line, and the output is equal to ground voltage, as is shown in FIG. 4(c). When the value of $(V_{cc} - V_{th})/2$ is increased beyond the voltage at point B, the transistor TR2 is turned on. By turning on the transistor TR2, the output at point D is reduced from about 3 V (experimentally, 2.6 to 2.4 V) to ground voltage, as is shown in FIG. 4(d).

In the above-mentioned embodiment, the P-channel transistor TR16 is used as the threshold value element, but another threshold value element, such as a diode or a Schottky diode, may be used instead of the transistor TR16. Furthermore, a plurality of threshold value elements may be used. Incidentally, if the output at point D falls after the power source voltage $V_{cc}$ reaches a predetermined level, there is the risk of elevation of the lower limit of the power source voltage range where the element as a whole can be operated.

When the output at point D is in a conductive state, the transistor TR8 is also in a conductive state, the transistors TR6 and TR7 are in an off state, and a voltage equal to the power source voltage $V_{cc}$ appears at the output terminal OUT. When a positive pulse is applied to the gate of the transistor TR13, the transistor TR13 is turned on and the output OUT falls to ground state, as is shown in FIG. 4(e).

Figure 5:
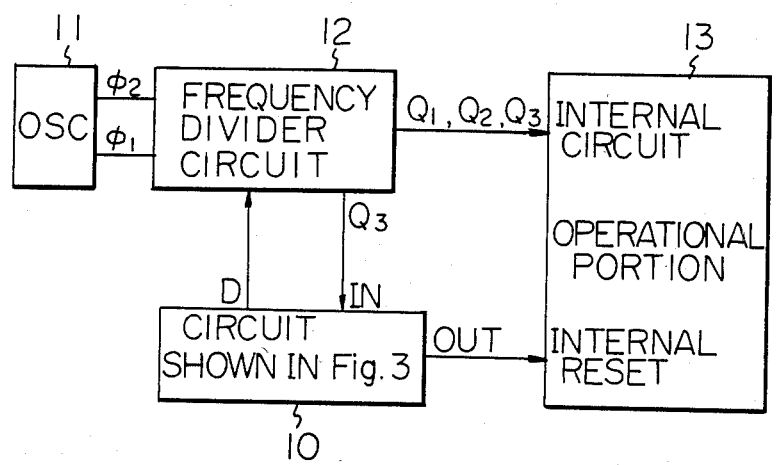
FIG. 5 is a block diagram of a practical utilization of the present invention.

FIG. 5 is a block diagram of the present invention as a control circuit of a frequency divider circuit. In FIG. 5, the frequency divider circuit 12 divides the output of an oscillator 11, and the divided output is supplied to an internal circuit of an operational portion 13. The circuit 10 of the present invention is used to automatically reset the frequency divider circuit 12 when the power source voltage is switched on.

Figure 6:
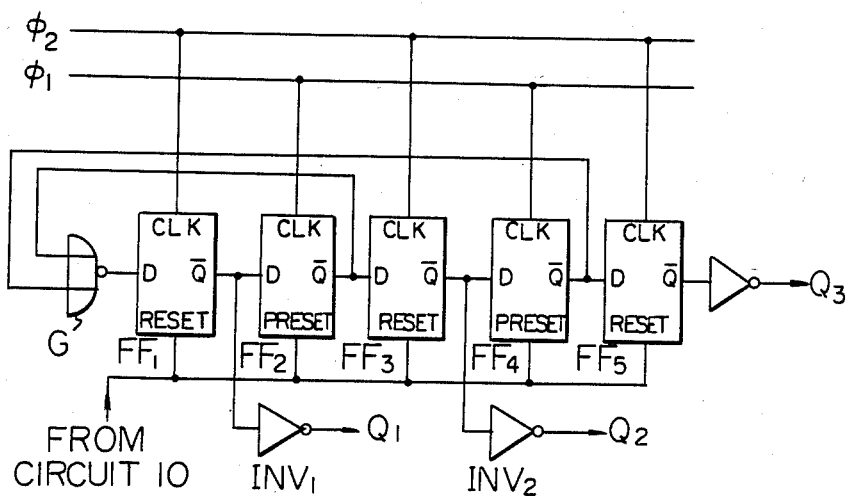
FIG. 6 is an example of the frequency divider circuit shown in FIG. 5.

FIG. 6 is an example of the frequency divider circuit 12 shown in FIG. 5. The circuit shown in FIG. 6 comprises flip-flop circuits FF$_1$, FF$_2$, FF$_3$, FF$_4$, and FF$_5$ which receive clock pulses $\phi_1$ and $\phi_2$, alternately. The Q outputs of the flip-flop circuits FF$_2$ and FF$_4$ are fed back via a gate G to a D input of the flip-flop circuit FF$_1$. The $\bar{Q}$ outputs of the flip-flop circuits FF$_1$, FF$_3$ and FF$_5$ are supplied via inverters INV$_1$, INV$_2$ and INV$_3$ to the internal circuit of the operational circuit 13, and the $\bar{Q}$ output of the flip-flop circuit FF$_5$ is supplied to the input terminal of the circuit 16 shown in FIG. 5. In FIG. 6, it should be noted that the signal corresponding to the potential at point D in FIG. 4(d) is supplied to the flip-flop circuits FF$_1$ to FF$_5$ as a reset signal or a preset signal alternately.

FIG. 7 is a timing chart showing the operation of the circuits shown in FIGS. 5 and 6. In FIG. 7, (a), (b), (c), (e) and (f) correspond respectively to FIG. 4(a), FIG. 4(b), FIG. 4(c), FIG. 4(d) and FIG. 4(e) on a different scale. When the signal shown in FIG. 7(e) is supplied to the frequency divider circuit 12, the initial values of the flip-flop circuits FF$_1$ to FF$_5$ are set, and the flip-flop circuits FF$_1$, FF$_3$ and FF$_5$ supply the outputs Q$_1$, Q$_2$ and Q$_3$ to the internal circuit of the operational portion 13. Also, the output Q$_3$ is supplied to the circuit 10 so as to reset the output shown in FIG. 7(f). The signal shown in FIG. 7(f) is supplied to the operational portion 13 as an internal reset signal.

As is apparent from the foregoing description, according to the present invention, since the threshold value element is inserted into the lead of the first inverter stage of the power source voltage buildup detecting circuit, the buildup of the output of the inverter can be delayed, and the output of the second inverter stage can be reduced sharply from the desired relatively high level to ground voltage. Accordingly, the output of the power source voltage buildup detecting circuit can be made more reliable and operation of the circuits of the electronic equipment can be guaranteed.

I claim:

1. A source voltage buildup detecting circuit which detects, after a source voltage is switched on, whether the source voltage is higher than a predetermined voltage and outputs a detecting signal accordingly, said source voltage buildup detecting circuit comprising:
   a complementary metal-oxide semiconductor (CMOS) inverter having a threshold voltage and an input terminal and providing an output signal;
   a level shifting element comprising one of a MOS transistor and a diode, operatively connected between the source voltage and said CMOS inverter; and
   a voltage generating circuit, operatively connected to the input terminal of said CMOS inverter, said level shifting element supplying a voltage lower than the source voltage to said CMOS inverter as a working voltage, when the source voltage becomes lower than the predetermined voltage after the source voltage is switched on, said voltage generating circuit outputs a voltage higher than the threshold voltage of said CMOS inverter, when the source voltage becomes higher than the predetermined voltage, said voltage generating circuit outputs a voltage lower than the threshold voltage of said CMOS inverter, and when the source voltage reaches the predetermined value, the output signal of said CMOS inverter is inverted.

2. A source voltage buildup detecting circuit according to claim 1, wherein said diode of said level shifting element comprises a Schottky diode.

3. A source voltage buildup detecting circuit according to claim 1, wherein said voltage generating circuit comprises:
   a capacitor having a first end operatively connected to the source voltage and having a second end;
   a resistive element having a first end operatively connected to the second end of said capacitor and having a second end; and
   a first transistor having a gate and a drain both operatively connected to the second end of said resistive element and a source operatively connected to ground, the connection point between said capacitor and said resistive element being operatively connected to the input terminal of said CMOS inverter.

4. A source voltage buildup detecting circuit according to claim 3, wherein said resistive element comprises a resistor.

5. A source voltage buildup detecting circuit according to claim 3, wherein said resistive element comprises:
   a second transistor having a first terminal operatively connected to the drain of said first transistor, a second terminal operatively connected to the second end of said capacitor and a gate operatively connected to ground; and
   a third transistor having a first terminal operatively connected to the first terminal of said second transistor, a second terminal operatively connected to the second terminal of said second transistor, and a gate operatively connected to the source voltage.

6. A source voltage buildup detecting circuit according to claim 5, wherein said second transistor comprises an P-channel MOS transistor and said third transistor comprises a N-channel MOS transistor.

* * * * *

UNITED STATES PATENT AND TRADEMARK OFFICE
CERTIFICATE OF CORRECTION

PATENT NO. : 4,558,233
DATED : DECEMBER 10, 1985
INVENTOR(S) : TUTOMU NAKAMORI

It is certified that error appears in the above-identified patent and that said Letters Patent is hereby corrected as shown below:

Col. 1, line 41, after "the" (second occurrence) insert --voltage--.

Col. 3, line 23, "inventer" should be --inverter--.

Signed and Sealed this

First Day of April 1986

[SEAL]

Attest:

DONALD J. QUIGG

Attesting Officer

Commissioner of Patents and Trademarks